(12) United States Patent
Ogawa

(10) Patent No.: US 7,273,795 B2
(45) Date of Patent: Sep. 25, 2007

(54) METHOD FOR FORMING A TRENCH ELEMENT SEPARATION REGION IN A SEMICONDUCTOR SUBSTRATE

(75) Inventor: Kazuo Ogawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 303 days.

(21) Appl. No.: 11/038,927

(22) Filed: Jan. 19, 2005

(65) Prior Publication Data
US 2005/0148154 A1 Jul. 7, 2005

Related U.S. Application Data

(63) Continuation of application No. 09/964,995, filed on Sep. 27, 2001, now abandoned.

(30) Foreign Application Priority Data
Sep. 28, 2000 (JP) .............. 2000-297485

(51) Int. Cl.
*H01L 21/762* (2006.01)
(52) U.S. Cl. .............. 438/435; 257/E21.546
(58) Field of Classification Search ........ 438/425
See application file for complete search history.

(56) References Cited
U.S. PATENT DOCUMENTS
6,258,697 B1 * 7/2001 Bhakta et al. .............. 438/437

FOREIGN PATENT DOCUMENTS
JP 2000223564 A * 8/2000

OTHER PUBLICATIONS
Takeshi Yamazaki, "Manufacture of Semiconductor Device," JPO, English Translation of JP 2000223564 A, Aug. 2000.*

* cited by examiner

Primary Examiner—Stephen W. Smoot
(74) Attorney, Agent, or Firm—Darryl G. Walker (57) ABSTRACT

A semiconductor device having a trench element separation region is disclosed. A pad oxide film (2), and a silicon nitride film (3) may be formed on a semiconductor substrate (1). A trench (4) may be formed by dry etching using the silicon nitride film (3) as a mask. The silicon substrate (1) may be thermally oxidized using the silicon nitride film (3) as an oxidation mask and a modified layer may be formed on the surface of the silicon nitride film (3). The modified layer may be removed by a neutral radical containing fluorine. The surface of the silicon nitride film (3) may be etched by a predetermined thickness. A filling insulation film may be deposited to completely fill the trench (4). The insulation film may then be chemical mechanical polished using the silicon nitride film (3a) as a polishing stopper to form a trench element separation insulation material (8).

20 Claims, 9 Drawing Sheets

METHOD FOR FORMING A TRENCH ELEMENT SEPARATION REGION IN A SEMICONDUCTOR SUBSTRATE

This application is a continuation of patent application Ser. No. 09/964,995 filed Sep. 27, 2001, which is now abandoned.

TECHNICAL FIELD

The present invention relates generally to a semiconductor device and a manufacturing method therefore and more specifically to a semiconductor device having a separation region including a trench element and a manufacturing method therefore.

BACKGROUND OF THE INVENTION

In order to decrease costs and/or improve performance it is desirable to provide semiconductor devices with more densely spaced structures. State of the art semiconductor elements can be formed with dimensions of about 0.15 μm. Such a minimum design rule is typical for state of the art semiconductor devices, such as memory devices and logic devices that are currently in research and development.

Miniaturization is an effective means of achieving a semiconductor device having improved high performance and multiple functions. Through a high level of integration, the speed of semiconductor devices may be improved and more components may be placed on a semiconductor device, thus improving functional capabilities. Thus, increasing the level of integration is essential for future semiconductor device manufacturing. In order to increase the level of integration, a trench filled with an insulating material can be used to electrically separate semiconductor elements. The use of a trench filled with an insulating material was proposed more than 20 years ago and was first applied to bipolar transistors although currently it has been applied to semiconductor devices having metal oxide semiconductor (MOS) transistors.

Figure 9:
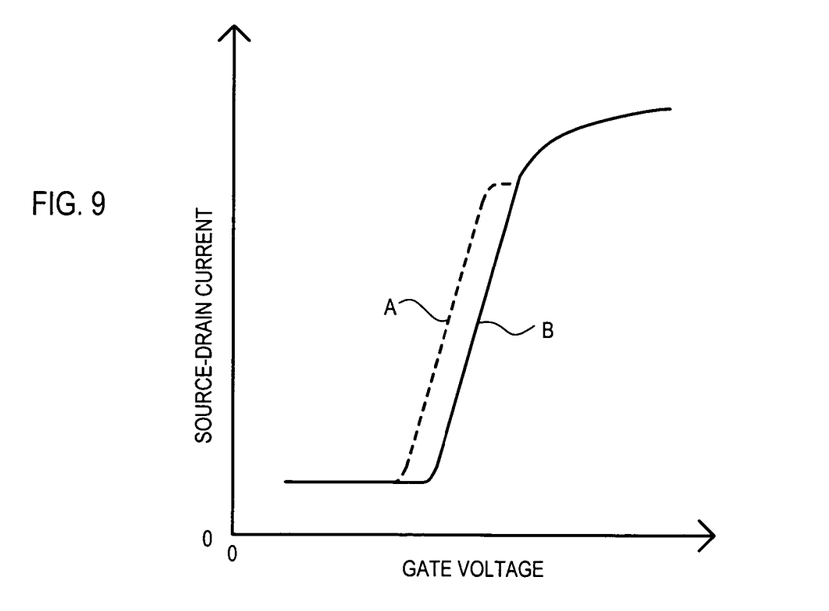
FIG. 9 is a graph illustrating the relationship between the source-drain current and the gate voltage of a MOS transistor.

When a trench filled with an insulating material is used to separate MOS transistors, a hump phenomenon can occur in the sub-threshold current characteristics. This will now be explained with reference to FIG. 9. Referring to FIG. 9, a graph illustrating the relationship between the source-drain current and the gate voltage of a MOS transistor is set forth. The current characteristics of a MOS transistor operating in an intended manner is illustrated by solid line B. The dashed line A illustrates an abnormal current in the sub-threshold region that can occur in a MOS transistor that is isolated with a trench filled with an insulating layer. The dashed line A becomes the same as the intended operation (solid line B) when the MOS transistor is fully turned on. The sub-threshold current bulge illustrated by the dashed line A, which appears in the source-drain current—gate voltage characteristics illustrated in FIG. 9, is called a hump.

When the hump phenomenon occurs, the threshold value of the MOS transistor can become smaller than the designed value. Also, the reliability of the gate insulation film of the MOS transistor may be reduced, so that more semiconductor devices become defective and yield decreases. The hump can be caused by the top section of the trench developing sharp corners and a deep cavity occurring in the insulating material filling the trench.

Figure 10:
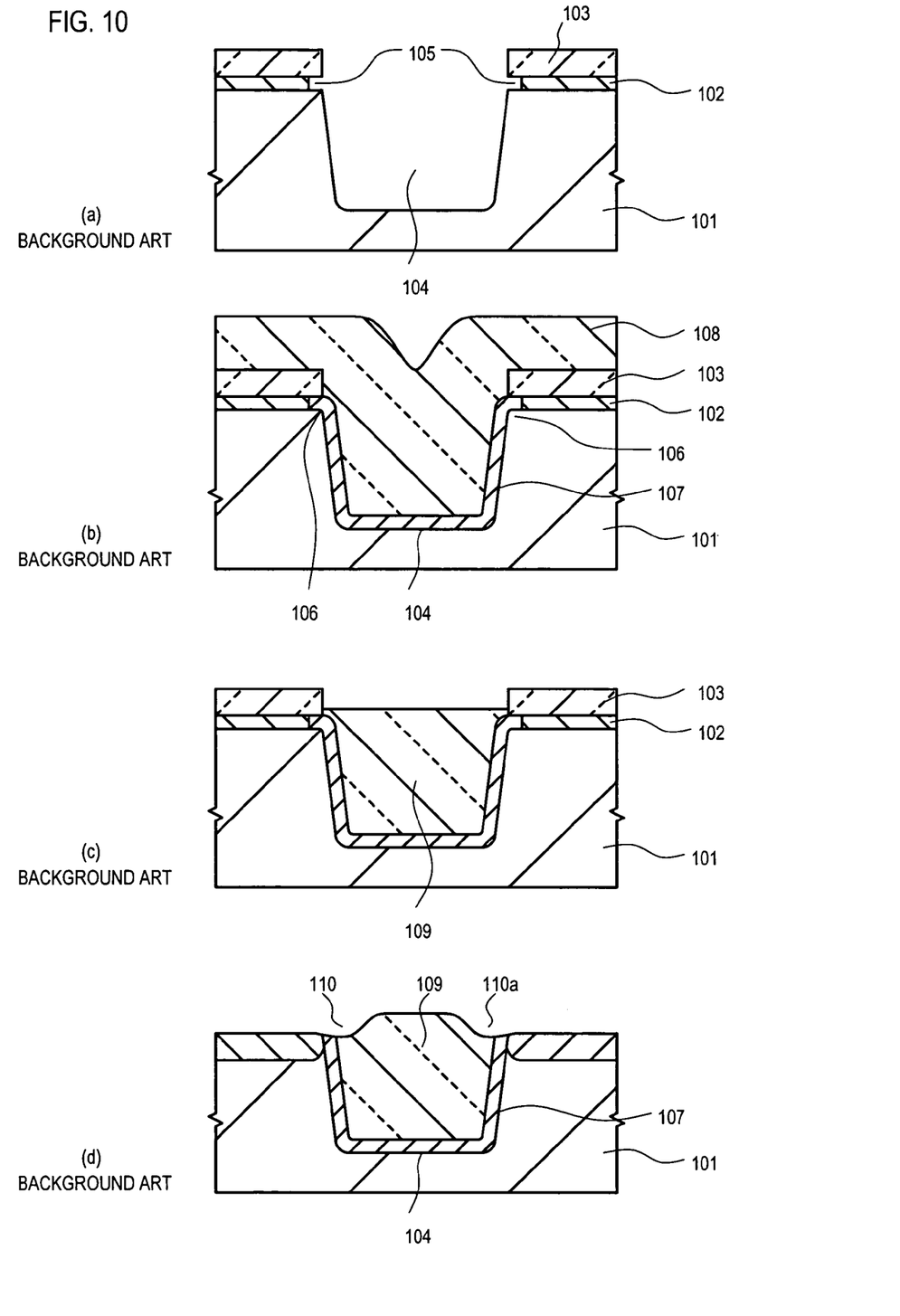

Various methods have been proposed to solve the above-mentioned hump characteristic. One example is described in Japanese Unexamined Patent Application, First Publication no. 2000-049222 (JPA-049222). The conventional approach described in JPA-049222 will now be described with reference to FIG. 10(a)-(d).

Referring now to FIG. 10(a)-(d), cross sectional views of a conventional trench element separation region after various processing steps is set forth. The reference numerals used may not be the same as the reference numerals used in JPA-049222.

As illustrated in FIG. 10(a), a trench 104 is formed in a predetermined region of a silicon substrate 101. The trench 104 is formed by dry etching while using a pad oxide film 102 and a silicon nitride film 103, which are patterned, as an etching mask. Then, the exposed sections of the pad oxide film 102 are etched to form recessed sections 105.

Next, as illustrated in FIG. 10(b), the surface of trench 104 exposed is isotropically etched to round off the corners of the trench top section, thus producing rounded corners 106. Then, thermal oxidation is performed to form a liner oxide film 107 on the inner surface of trench 104. In this case, the liner oxide film 107 is integrated with the pad oxide film 102. Then, a filling insulation film 108 is deposited all over by a chemical vapor deposition (CVD) method such that silicon nitride film 103 is covered and trench 104 is filled.

Next, the filling insulation film 108 is polished by a standard chemical mechanical polishing (CMP) method using the silicon nitride film 103 as a polishing stopper. The result, as illustrated in illustrated in FIG. 10(c), is that a trench element separation insulating material 109 fills the trench 104.

Next, as illustrated in FIG. 10(d), silicon nitride film 103 and pad oxide film 102 are removed by etching. In this way, the sharp corners on the top section of the trench 104 are rounded. A trench element separation region, which is filled with liner oxide film 107 and trench element separation insulating material 109, is formed in the trench 104 in a predetermined region of the silicon substrate 101. Referring back to FIG. 10(c), silicon nitride film 103 can have an overhang occupying space at the edges of the trench 104. The trench element separation insulating material 109 can not fill the trench 104 at the space occupied by the overhang in the formed silicon nitride film 103. Thus as illustrated in FIG. 10(d), cavities (110 and 110a) are easily formed at the edges of trench element separation insulating material 109.

Through subsequent processes (not shown), a gate insulating film is formed. A gate electrode is then formed over the gate insulating film. In this manner, a MOS transistor is formed and isolated by using the trench element separation region.

A number of techniques have been disclosed to prevent cavities from occurring at the edges of the trench element separation insulation material. One technique is a method described in U.S. Pat. No. 5,981,356 (U.S. Pat. No. 5,981,356) where, in the formation of the trench element insulation material, a pullback process for slightly etching the surface of the silicon nitride is added after the liner oxide film formation process and before the filling insulation film is formed.

Figure 11:
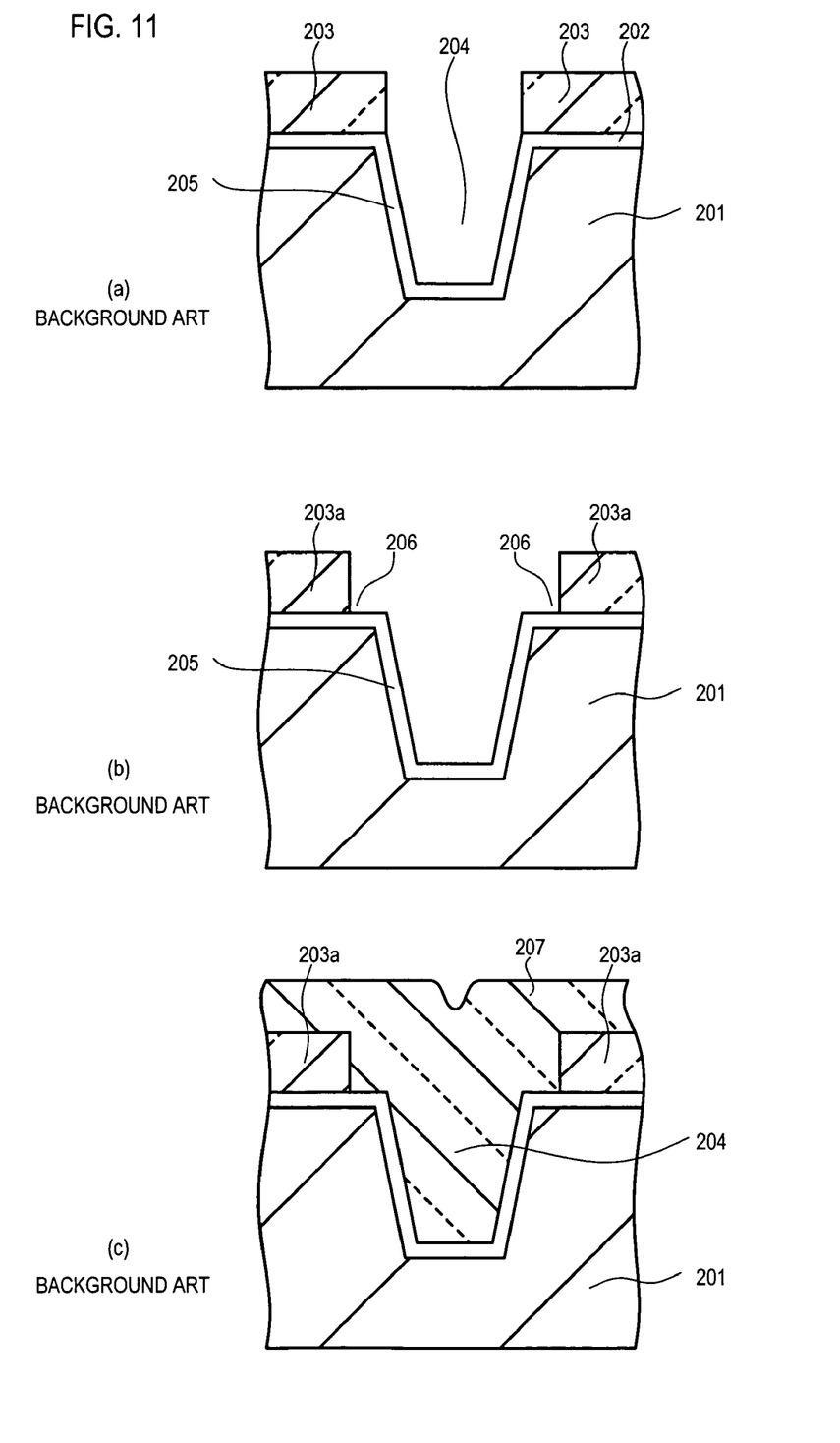
Figure 12:
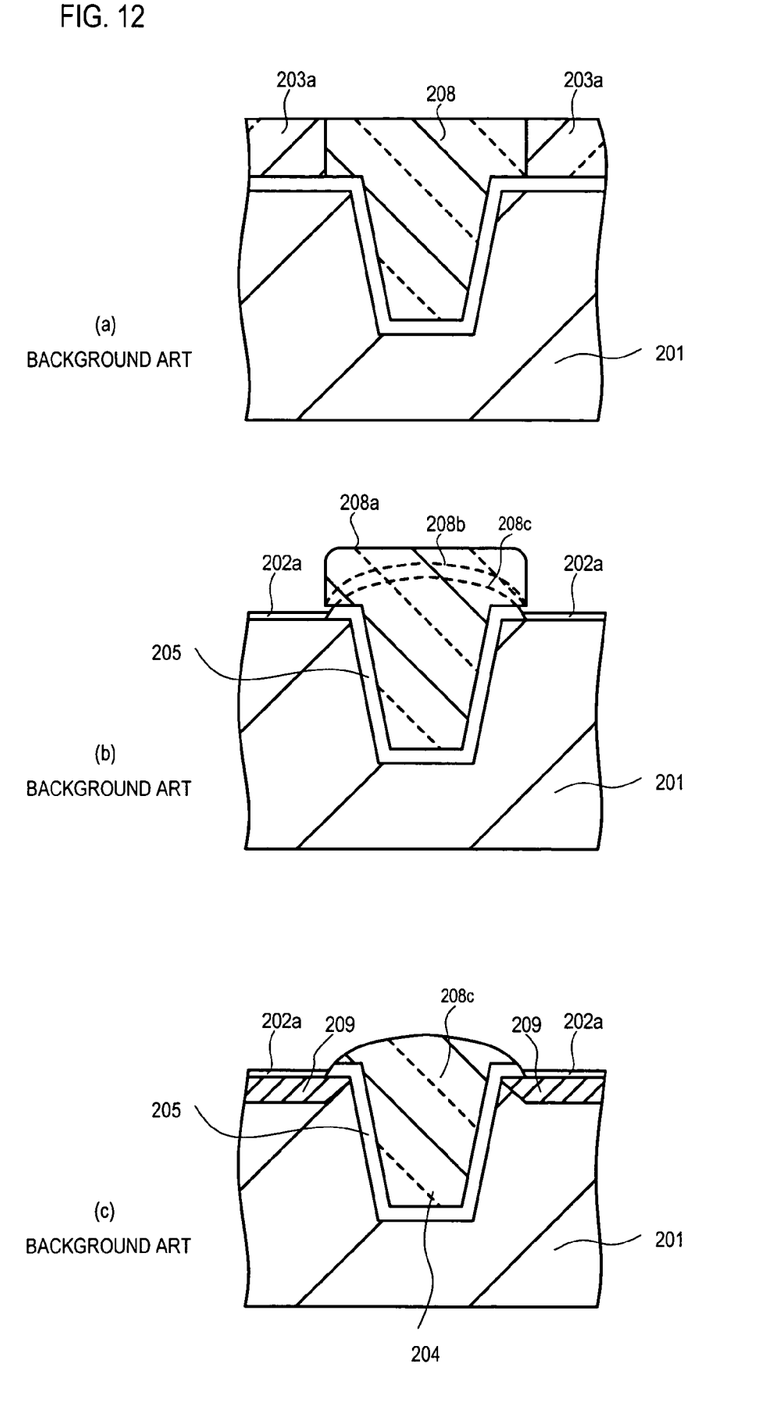

The conventional technique disclosed in U.S. Pat. No. 5,981,356 will now be described with reference to FIGS. 11(a)-(c) and FIGS. 12(a)-(c).

Referring now to FIGS. 11(a)-(c) and FIGS. 12(a)-(c), cross-sectional views of a conventional trench element separation region after various processing steps is set forth. The reference numerals used may not be the same as the reference numerals used in U.S. Pat. No. 5,981,356.

As illustrated in FIG. 11(a), a pad oxide film 202 and a silicon nitride film 203 are patterned in a predetermined region of a silicon substrate 201 and used as an etching mask. In this way, a trench 204 is formed by dry etching. Then a liner oxide film 205 is formed on the inner surface of the trench 204. In this case, the liner oxide film 205 is integrated with the pad oxide film 202 by thermal oxidation.

As illustrated in FIG. 11(b), the semiconductor device is immersed in a phosphoric acid solution thereby etching the surface of the silicon nitride film 203 and a silicon nitride film 203a is formed. The step of etching the silicon nitride film 203 is called a pullback process. Edges 206 of the silicon nitride film 203a move backward from the top sections of the trench and leave the formation region of the liner oxide film 205.

Next, as illustrated in FIG. 11(c), the filling insulation film 207 is deposited all over such that the silicon nitride film 203a is covered and the trench 204 is filled.

Then, as illustrated in FIG. 12(a), the filling insulation film 207 is polished by the CMP method using the silicon nitride film 203 as a polishing stopper so that a trench element separation insulating material 208 fills the trench.

Next, as illustrated in FIG. 12(b), the silicon nitride film 203a is removed by etching. Then, the surface of trench element separation insulating material 208 is reshaped by argon sputtering or the like to form a smooth trench element separation insulating material 208a. The thickness of the pad oxide film 202 is thinned by the abovementioned process to form a pad oxide film 202a. In this case, the liner oxide film 205 is protected by the trench element separation insulating material 208a, so that it is not etched by the abovementioned process. In the conventional example illustrated in U.S. Pat. No. 5,981,356, the trench element separation insulating material 208c extends beyond the top section of the trench 204 because the edges 206 of the silicon nitride film 203a were moved backward from the top section of the trench in the pullback process. The extension of the trench element separation insulating material 208c beyond the top section of the trench 204 is illustrated in FIG. 12(c). This extension can be referred to as an edge section of the trench element separation insulating material 208c.

While not described in U.S. Pat. No. 5,981,356, a diffusion layer 209 (illustrated in FIG. 12(c)) is formed as a channel doped layer of a MOS transistor during the manufacturing of MOS transistors in succeeding processes. However, the diffusion layer 209 can become non-uniform in depth from the surface of the silicon substrate 201. This is due to the difference in the thickness of the pad oxide film 202a and the edge section of the trench element separation insulating material 208c. This difference in thickness causes a non-uniformity of the depth of impurity ions below the surface of the silicon substrate 201 after an ion implantation step is performed.

In this manner, a trench element separation region is formed in the trench 204 in a predetermined region of the silicon substrate 201 by filling the trench 204 with a liner oxide film 205 and a trench element separation insulating material 208c.

In subsequent processes (not shown in the figure), a gate insulating film is formed. A gate electrode is then formed over the gate insulating film. In this manner, a MOS transistor is formed and isolated by used the trench element separation region.

As mentioned above, when using the conventional technique disclosed in JPA-049222, cavities can readily occur at the edges of the trench element separation insulating material. In a manufacturing process of semiconductor devices having trench element separation regions, it is extremely difficult to control the abovementioned cavities using this technique. As previously mentioned, this is because the silicon nitride film 103 can readily form an overhanging shape at the top section of the trench 104. It can be difficult to control this overhanging shape.

Furthermore, in the conventional technique disclosed in U.S. Pat. No. 5,981,356, the depth of the diffusion layer can become non-uniform, so that the impurity concentration of the channel doped layer of the MOS transistor becomes non-uniform. Thus, the dispersion of the threshold of the MOS transistor can become large. This dispersion becomes significant when the channel width of the MOS transistor becomes small.

In the conventional technique disclosed in U.S. Pat. No. 5,981,356, the occurance of the above-mentioned cavities may be theoretically avoided. However, if this technique is applied to a high volume semiconductor device production process, the above-mentioned cavities can occur and the depth of the diffusion layers can widely vary. This is due to the above-mentioned pullback process. Furthermore, the distance that the edge section 206 of the silicon nitride film is moved back from the top section of the trench 204 may not be controlled.

In light of the above discussion, it would be desirable to provide a semiconductor device which may have a trench element separation structure that can be precisely formed and a manufacturing method therefore.

SUMMARY OF THE INVENTION

According to the embodiments of the present invention, a semiconductor device having a trench element separation region is disclosed. A pad oxide film and a silicon nitride film may be formed on a semiconductor substrate. A trench may be formed by dry etching using the silicon nitride film as an oxidation mask and a modified layer may be formed on the surface of the silicon nitride film. The modified layer may be removed by a neutral radical containing fluorine. The surface of the silicon nitride film may be etched by a predetermined thickness. A filling insulation film may be deposited to completely fill the trench. The insulation film may then be chemical mechanical polished using the silicon nitride film as a polishing stopper to form a trench element separation insulation material. In this way, the trench element separation region may be formed.

According to one aspect of the embodiments, a semiconductor device may include a trench element separation region including a trench formed in a surface of a semiconductor substrate. The trench element separation region may isolate separate semiconductor elements. An oxide film may be formed on inner walls of the trench. A trench filling insulating material may fill the trench and have edges above the inner walls of the trench. A top section of the trench and the edges of the trench filling insulating material may be formed, so as to be essentially located on the same plane.

According to another aspect of the embodiments, the edges of the trench filling insulating material may be defined by side edges of a sacrificial layer.

According to another aspect of the embodiments, the sacrificial layer may be a silicon nitride film.

According to another aspect of the embodiments, the side edges of the sacrificial layer may be formed by an etching process including a neutral radical.

According to another aspect of the embodiments, the semiconductor elements may be insulated gate field effect transistors (IGFET).

According to another aspect of the embodiments, the IGFETS may have opposite conductivity types.

According to another aspect of the embodiments, a semiconductor device includes a trench element separation region including a trench formed in the surface of a semiconductor substrate. The trench element separation region isolates a first doped channel layer of a first insulated gate field effect transistor (IGFET) from a second doped channel layer of a second IGFET. An oxide film may be formed on inner walls of the trench. A trench filling insulating material may fill the trench and have edges above the inner walls of the trench. Inner wall edges in a top section of the trench and the edges of the trench filling insulating material may be formed so as to be essentially located on the same plane.

According to another aspect of the embodiments, the edges of the trench filling insulating material may be defined by side edges of a sacrificial layer.

According to another aspect of the embodiments, the side edges of the sacrificial layer may be formed by an etching process including a fluorine radical.

According to another aspect of the embodiments, the first and second doped channel layers may by of the same conductivity types.

According to another aspect of the embodiments, the first and second doped channel layers may be of opposite conductivity types.

According to another aspect of the embodiments, a method for forming a trench element separation region on a surface of a semiconductor substrate may include the steps of depositing a first insulation film onto the surface of the semiconductor device, depositing and patterning a second insulation film to form a second insulation film pattern, dry etching the semiconductor substrate using the second insulation film pattern as an etching mask to form a trench, forming an oxide film on an inner wall of the trench by thermally oxidizing the semiconductor substrate using the second insulation film pattern as an oxidation mask, removing a modified layer formed on the surface of the second insulation film during the thermal oxidation step by using a neutral radical including fluorine, etching the surface of the second insulation film by a predetermined thickness after the modified layer is removed, depositing a filling insulation film over the whole surface of the trench to completely fill the trench after the surface of the second insulation film is etched, and chemically mechanical polishing the filling insulation film using the second insulation film as a polishing stopper to form a trench filling insulating material.

According to another aspect of the embodiments, the second insulation film may include a silicon nitride film.

According to another aspect of the embodiments, the semiconductor substrate may be a silicon substrate and the neutral radical may be a fluorine radical.

According to another aspect of the embodiments, a final judgment of the modified layer removal may be performed by measuring a change in intensity of emissions with a wavelength of approximately 336 nm from a reaction product NH.

According to another aspect of the embodiments, a final judgment of the modified layer removal may be performed by measuring a change in intensity of emissions with a wavelength of approximately 388 nm from a reaction product CN.

According to another aspect of the embodiments, the thickness of the second insulation film may be etched for adjustment such that the edges of the trench insulating material above the inner walls of the trench may be essentially located on the same plane at edges of the inner walls of the trench in a top section of the trench.

According to another aspect of the embodiments, the method for manufacturing the semiconductor device may include the step of forming a doped channel layer of an insulated gate field effect transistor (IGFET) by ion implantation and heat treatment after the trench filling insulating material is formed.

According to another aspect of the embodiments, the first insulation film may be a silicon oxide film formed by thermal oxidation of the semiconductor substrate. The filling insulation film may be a silicon oxide film deposited by a vapor deposition method.

According to another aspect of the embodiments, the trench element separation region may isolate a first IGFET from a second IGFET.

BRIEF DESCRIPTION OF THE DRAWINGS

FIG. 1(a)-(d) are cross sectional views of a trench element separation region after various processing steps according to a first embodiment.

FIG. 2(a)-(c) are cross sectional views of a trench element separation region after various processing steps according to a first embodiment.

FIG. 7(a)-(b) are cross-sectional views of a trench element separation region after diffusion layers are formed.

FIG. 10(a)-(d) are cross sectional views of a conventional trench element separation region after various processing steps.

FIG. 11(a)-(c) are cross sectional views of a conventional trench element separation region after various processing steps.

FIG. 12(a)-(c) are cross sectional views of a conventional trench element separation region after various processing steps.

DETAILED DESCRIPTION OF THE EMBODIMENTS

Various embodiments of the present invention will now be described in detail with reference to a number of drawings.

Figure 1:
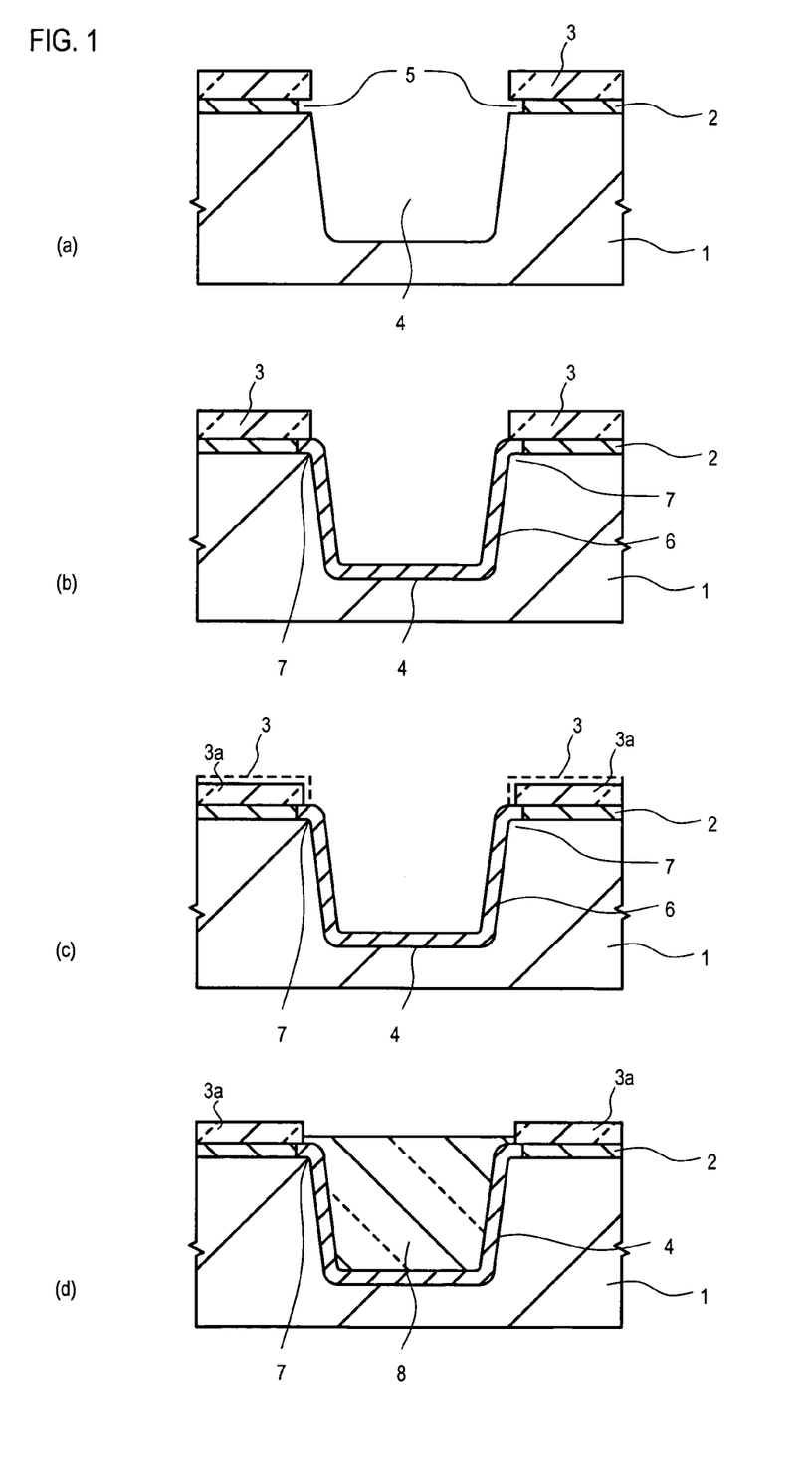
Figure 2:
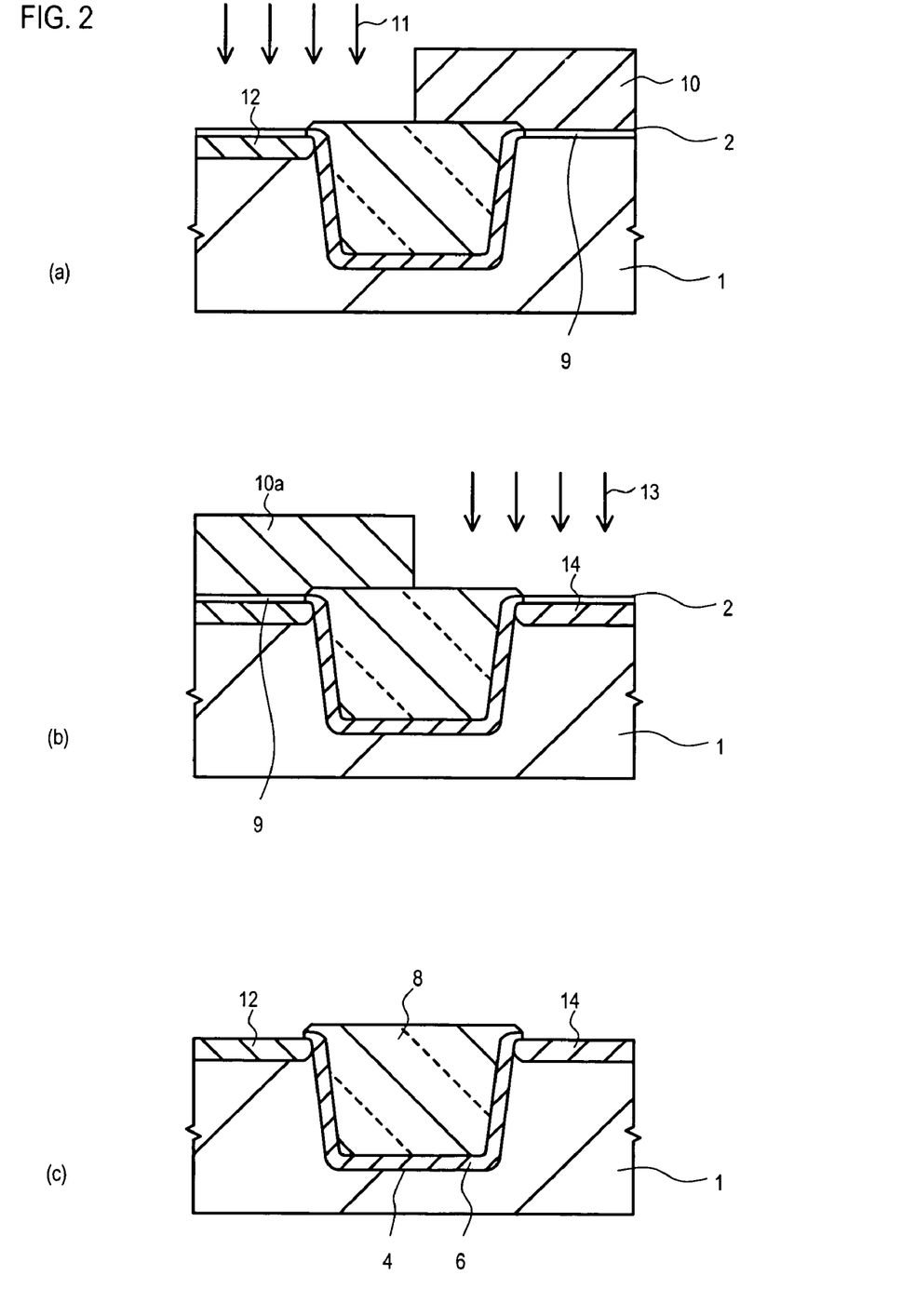
Figure 3:
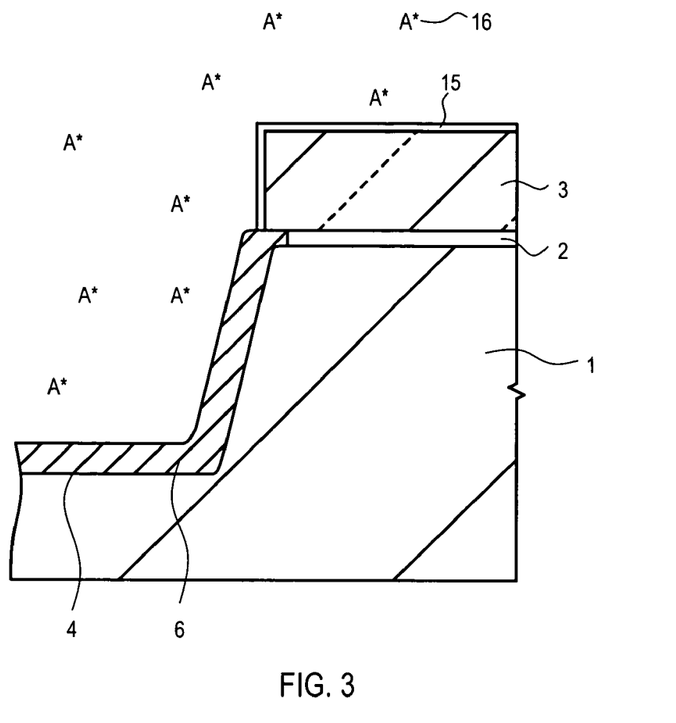
FIG. 3 is a cross-sectional view illustrating one process in the formation of the trench element separation region according to the first embodiment.

A first embodiment of the present invention will now be described with reference to FIGS. 1 to 3. FIG. 1(a)-(d) and FIG. 2(a)-(c) are cross sectional views of a trench element separation region after various processing steps according to a first embodiment. FIG. 3 is a cross-sectional view illustrating one process in the formation of the trench element separation region according to the first embodiment.

Various manufacturing process steps as described in FIG. 10(a)-(b) of the conventional approach may be similar to process steps in embodiments of the present invention. As illustrated in FIG. 1, a trench 4 may be formed in a predetermined region of a silicon substrate 1. Trench 4 may be formed by dry etching using a patterned pad oxide film 2 and a silicon nitride film 3 as an etching mask. The pad oxide film 2 may be a first insulation film and the silicon nitride film 3 may be a second insulation film. Pad oxide film 2 may be a silicon oxide film having a thickness of about 10 nm. Silicon nitride film 3 may have a thickness of about 150 nm. Recessed sections 5 may be formed in the exposed sections of pad oxide film 2 by etching.

Then, as illustrated in FIG. 1(b), the surface of trench 4 may be thermally oxidized under predetermined conditions to form a liner oxide film 6. Liner oxide film 6 may be a silicon oxide film with a thickness of about 20 nm. In this case, the liner oxide film 6 may be integrated with pad oxide film 2. The sharp corners may be removed by the above-mentioned thermal oxidization to provide round corners 7.

By using thermal oxidization to form the liner oxide film 6, the surface of silicon nitride film 3 may be slightly modified to an oxide nitride film. The oxide nitride film may be referred to as a modified layer. The present invention may remove the modified layer with extremely high accuracy using a method as will be described in detail later in conjunction with FIG. 3.

Subsequently, as illustrated in FIG. 1(c), the surface of the silicon nitride film 3 may be etched with high accuracy. In this way, a highly accurate pullback process may be performed. In the pullback process, the silicon nitride film 3 illustrated with dashed lines in FIG. 1(c) may be etched back evenly, thus leaving a silicon nitride film 3a. The amount of backward movement may be set to a predetermined value with high accuracy. The etching back may include a etching liquid such as a standard hot phosphoric acid solution.

Next, a filling insulation film may be deposited by plasma CVD (chemical vapor deposition) using a bias ECR (Electron Cyclotron Resonance) method. In this method, a monosilane ($SiH_4$) gas and a nitrous suboxide ($N_2O$) gas may be excited into a plasma to deposit a silicon oxide film. In this case, a direct current bias may be applied between the above-mentioned plasma and the silicon substrate. A filling insulation film generated by this bias ECR method may be a film with especially high consistency for a silicon oxide film formed by the CVD method.

Heat treatment at about 650° C. in an oxygen atmosphere may be performed on the filling insulation film. This heat treatment may be called a filling insulation film biscuitware process. The filling insulation film may be further condensed by this biscuitware process.

A method where a laser may be trained on the surface of the filling insulation film may be used for a method of condensing the filling insulation film. The radiation from the laser may transfer energy to the surface of the filling insulation film. The laser used may be an excimer laser from fluorine ($F_2$) gas. The laser may produce a beam having a wavelength of about 157 nm. The beam may not be transmitted through the silicon oxide film including the filling insulation film. Therefore, the energy of the laser may be absorbed only into the surface of the filling insulation film. Alternatively, the laser may be an excimer laser from ArF gas. In this case, the wavelength may be 193 nm and the insulation layer may be condensed to a deeper level than in the above-mentioned case. The temperature of the silicon substrate 1 may remain at about room temperature. A low pressure oxygen atmosphere may be a suitable atmosphere in this case.

If the insulation film is condensed as mentioned above, etching of the trench filling insulating material (described later) in a semiconductor device manufacturing processes that require hydrofluoric acid solutions may be suppressed.

As illustrated in FIG. 1(d), the filling insulation film may be polished by a chemical mechanical polishing (CMP) method using the silicon nitride film 3a as a polishing stopper. In this way, a trench element separation insulating material 8 may fill the trench 4 as a filling insulating material.

Silicon nitride film 3a and pad oxide film 2 may be removed and the main surface of silicon substrate 1 may be exposed. In this process, the surface of the trench element separation insulating material 8 may also be etched. The main surface of the silicon substrate 1 may then be thermally oxidized so that a protective insulation film 9 is formed as illustrated in FIG. 2(a). A resist mask 10 may then be formed and used as a mask for the implantation of N-type impurity ions 11. Thus, an N-type diffusion layer may be formed.

Similarly, as illustrated in FIG. 2(b), a resist mask 10a may be formed and used as a mask for the implantation of P-type impurity ions 13. In this way, a p-type diffusion layer 14 may be formed. The N-type diffusion layer 12 and P-type diffusion layer 14 may become doped channel layers for insulated gate field effect transistors (IGFET) such as a metal oxide semiconductor (MOS) transistors. The N-type diffusion layer 12 and P-type diffusion layer 14 may be doped channel layers for complementary transistors.

Next, the protective insulation layer 9 may be removed by a hydrofluoric acid solution. In the removal process of the protective insulation layer 9, the surface and edges of the trench element separation insulating material 8 may also be etched. In this way, a trench element separation region that has a liner oxide film 6 and is filled with a trench element separation insulating material 8 may be formed in the trench 4 in a predetermined region of the silicon substrate 1 as illustrated in FIG. 2(c). Then, the N-type diffusion layer 12 and P-type diffusion layer 14 may be formed as doped channels for MOS transistors on the surface of the silicon substrate and may be separated by the trench element separation insulating material 8.

In subsequent processes, similar to the conventional approach, a gate insulation film may be formed. Gate electrodes may then be formed on the gate insulation film, so that IGFETs, such as MOSFETs, may be formed and electrically separated or isolated by the trench element separation region.

Referring now to FIG. 3, a cross-sectional diagram illustrating a removal step of a modified layer according to an embodiment is set forth.

As illustrated in FIG. 3, the surface of the silicon nitride film 3 may include a modified layer that is an oxide nitride film 15. As discussed with reference to FIG. 1, liner oxide film 6 may be formed by predetermined thermal oxidation after the trench 4 is formed in a predetermined region of the silicon substrate 1 using the pad oxide film 2 and the silicon nitride film 3 as a dry etching mask. In this thermal oxidization process, the surface of the silicon nitride film 3 may be modified to an oxide nitride film 15 (FIG. 3).

In the present invention, the removal of the oxide nitride film 15 may be performed by the following dry etching. A fluorine compound and oxygen may be excited to a plasma in a plasma excitation chamber. Then, a silicon substrate with a structure as shown in FIG. 3, may be mounted into a chamber separate from the plasma excitation chamber. Into this chamber a neutral radical A* may be introduced. The neutral radical A* may have a long life span within the active substances produced in the plasma excitation chamber. In the present invention, the modified layer comprised of the oxide nitride film 15 may be selectively removed by the neutral radical A*. In this way, the silicon nitride film 3 may be etched uniformly with high accuracy in the pullback process.

In the pullback process, a mixed gas of $CHF_3$, $O_2$, and He may be excited by plasma with a high frequency of about 13.56 MHz. A neutral radical 16 occurring from this plasma excitation may be a fluorine radical. Then, the oxide nitride film 15 may be removed by the fluorine radical in about 30 seconds. To remove only the oxide nitride film 15 with high accuracy, a final judgment may be performed during the plasma etching. When the plasma etching starts, the oxide nitride film 15 and the fluorine radical may react chemically and a reaction product NH may occur. The change in intensity of 336 nm emissions from the NH may be monitored. When the oxide nitride film 15 is removed, the silicon nitride film 3 may be exposed. At this point, the silicon nitride film 3 and the fluorine radical may react chemically and the NH may be rapidly increased. Thus, the intensity of emissions of 336 nm may rapidly increase. The final judgment can be made based on the variation in the emission intensity or the variation in the rate of change of the intensity.

Alternatively, the neutral radical 16 may be generated by plasma excitation using a mixed gas of $CF_4$, $O_2$, and He. In this case, the neutral radical 16 can also be a fluorine radical. The final judgment in this case may be performed by monitoring the change in intensity of 388 nm emissions emitted from CN being the reaction product.

In this removal process of the oxide nitride film 15, it may be desirable that etching of the liner oxide film 6 does not occur. This will described based on Table 1 as follows. Table 1 illustrates a comparison between the etching of the liner oxide film 6 using two methods of the present invention as compared to a conventional method.

|  | Liner Oxide Film Etching Amount |
| --- | --- |
| Present Invention (1) | ⅓ |
| Present Invention (2) | ⅕ |
| Conventional Method | 1 (for example 9 nm) |

In a conventional trench element separation region method described in the background an oxide nitride film may be formed on a nitride film that is removed in a dilute hydrofluoric acid solution. In Table 1, removal in this hydrofluoric acid solution is illustrated as conventional method. The case of removal by plasma excitation of mixed gas of $CHF_3$, $O_2$, and He is illustrated as present invention (1). The case of removal by plasma excitation of mixed gas of $CF_4$, $O_2$, and He is illustrated as present invention (2).

As illustrated in Table 1, in the conventional method, the liner oxide film 6 is etched by about 9 nm when the oxide nitride film 15 is completely removed. In the case of the present invention (1), the liner oxide film 6 may be etched by about 3 nm. Thus, the present invention (1) etches the liner oxide film 6 by about ⅓ as much as in the conventional method. In the case of the present invention (2), the liner oxide film 6 may be etched by about ⅕ as much as in the conventional method.

Figure 4:
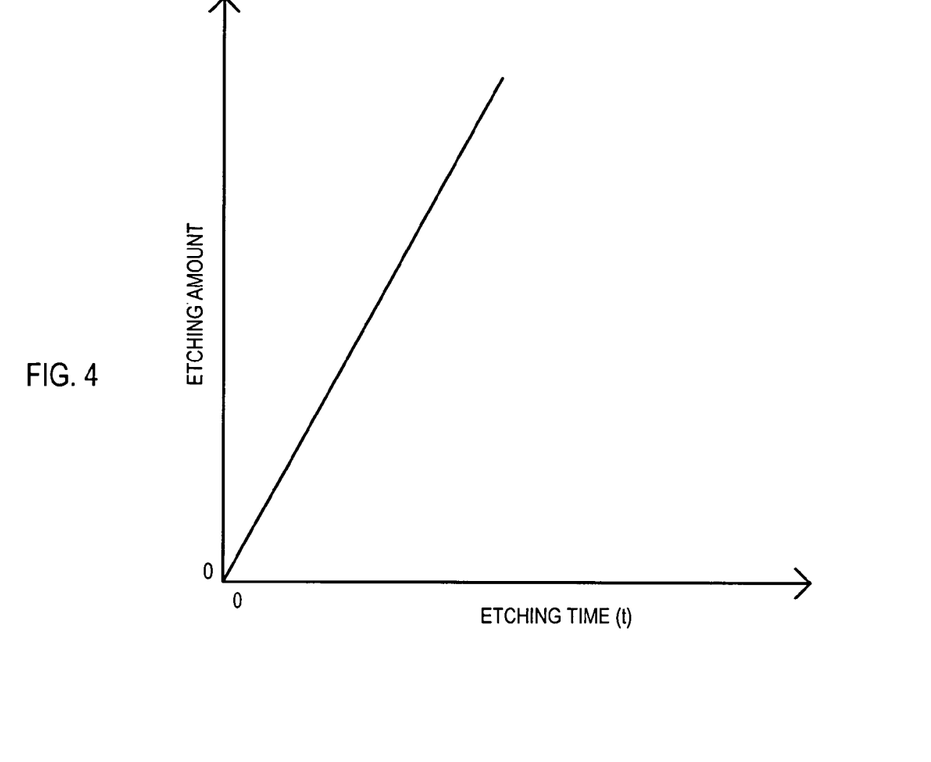
FIG. 4 is a graph illustrating the relationship between the etching amount and the etching time of the silicon nitride film in the etching process according to the present invention.

The effects of the invention will now be described with reference to FIGS. 4 to 8. Referring now to FIG. 4, a graph illustrating the relationship between the etching amount and the etching time of the silicon nitride film in the etching process according to the present invention. The etching amount is measured after the pullback process of the surface of the silicon nitride film 3 whereby the oxide nitride film 15 is removed by the method of the present invention.

As shown in FIG. 4, the etching amount of the silicon nitride film 3 can be directly proportional to the etching time. In this case, there is no time period in which etching is inoperative. As a result, the present invention may enable uniform etching of the silicon nitride film 3 with a high accuracy.

Figure 5:
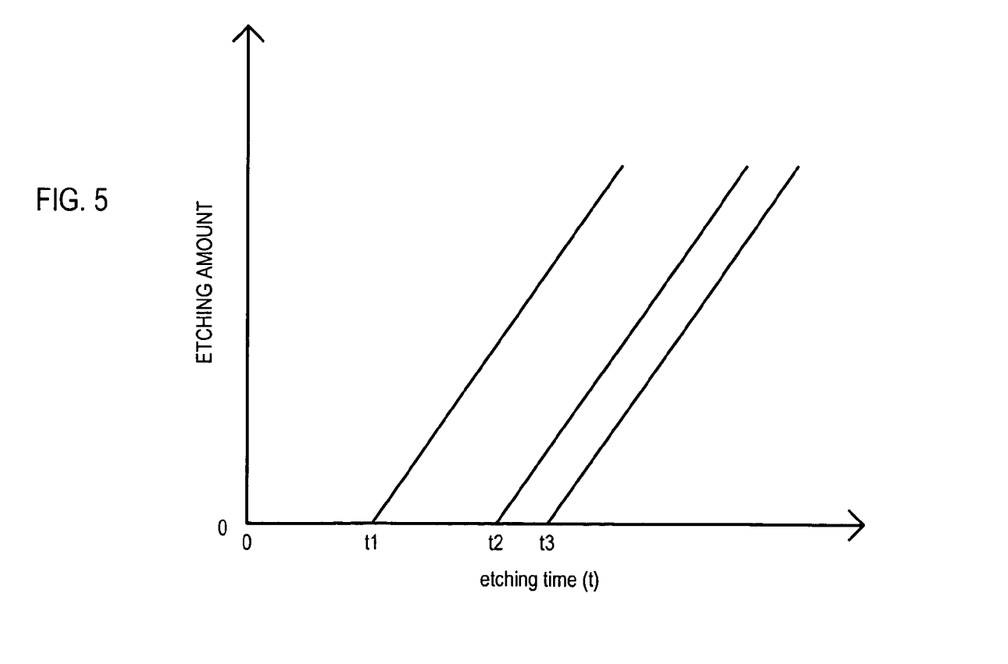
FIG. 5 is a graph illustrating the relationship between the etching amount and the etching time of the silicon nitride film in the conventional etching process according to the conventional method.

Referring now to FIG. 5, a graph illustrating the relationship between the etching amount and the etching time of the silicon nitride film in the conventional etching process according to the conventional method. The etching amount is measured after the pullback process of the surface of the silicon nitride film 3 whereby the oxide nitride film 15 is removed by the conventional method. Here, the etching solution of the silicon nitride film 3 is a standard hot phosphoric acid solution.

As shown in FIG. 5, when incorporating the conventional etching process there are etching inoperative times illustrated as t1, t2, and t3. During the etching inoperative time, etching of the silicon nitride film does not occur. This is because the oxide nitride film, being a modified layer, cannot be removed by a dilute hydrofluoric acid solution completely and stably. The etching inoperative time varies widely in the manufacturing process as illustrated with etching inoperative times (t1, t2, and t3) shown in FIG. 5. Thus, etching of the silicon nitride film 3 cannot be performed with high accuracy by using the conventional method.

Figure 6:
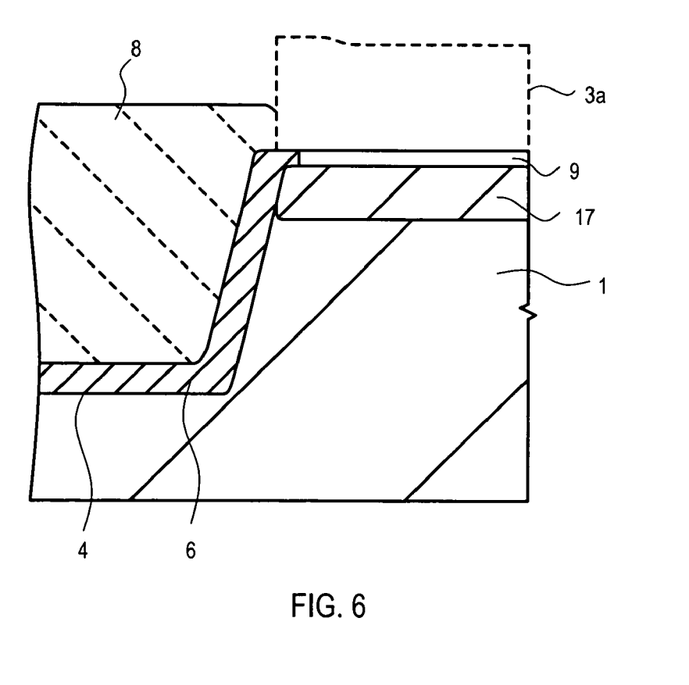
FIG. 6 is a cross-sectional view of a trench element separation region after diffusion layers are formed according to an embodiment.
Figure 7:
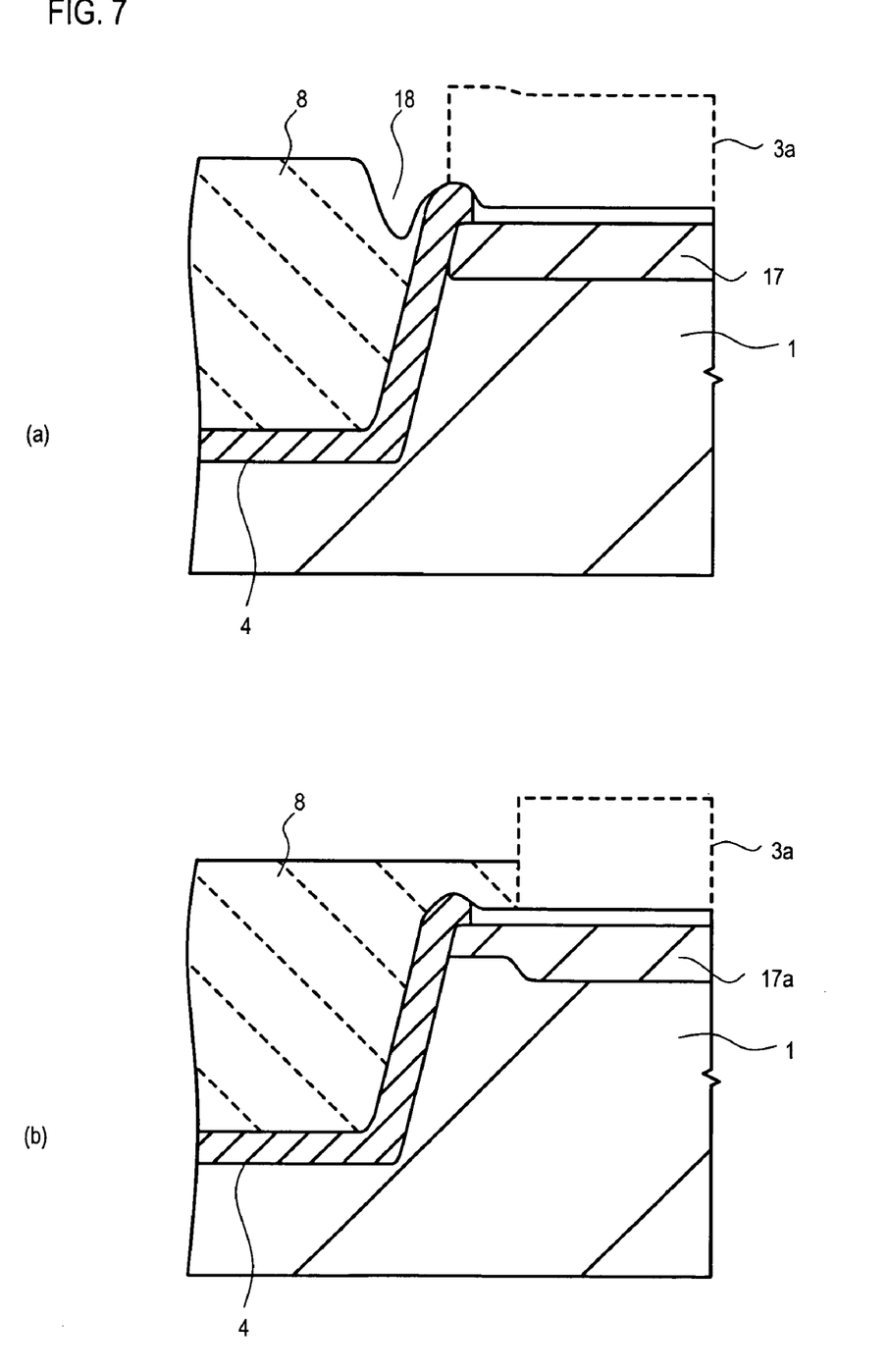

As illustrated in FIG. 4, the present invention may enable etching of the silicon nitride film by a pullback process with high accuracy. Therefore, the present invention may enable tight control over the formation of a trench element separation region. The effect will be described based on FIG. 6 to FIG. 8. FIG. 6 and FIG. 7 are cross-sectional views of a trench element separation region after the N-type (P-type) diffusion layers described in FIG. 2 are formed. Similar elements may include the same reference character as in FIG. 1 and FIG. 2.

As illustrated in FIG. 6, the trench 4 may be formed in a predetermined region of the silicon substrate 1. Liner oxide film 6 may be formed on the trench walls and the trench element separation insulating material 8 may fill the trench 4. The silicon nitride film 3a (illustrated by a dashed line) may be removed and a diffusion layer 17 may be formed by ion implantation through the protective insulation film 9 and a subsequent heat treatment. Diffusion layer 17 may correspond to the previously described N-type diffusion layer 12 or P-type diffusion layer 14 of FIG. 2. Diffusion layer 17 may become the doped channel layer of an IGFET, such as a MOS transistor.

The present invention may enable highly accurate etching of the silicon nitride film 3 by the pullback process. This may enable the relative relationship of the location between the edges of the silicon nitride film 3a (shown as the dashed line at the edge of the trench element separation insulating material 8) and the top section of the trench 4 to be controlled with high accuracy. In the ion implantation process, the edge of the trench element separation insulating material 8 and the top section of the trench 4 may be formed so as to be essentially located on the same plane. Furthermore, the diffusion layer 17 may be formed evenly on the surface of the silicon substrate 1. In this case, the silicon nitride film 3a may be conceptualized as a sacrificial layer that may define the edge of the trench element separation insulating material 8.

However, in the conventional method, etching inoperative time readily occurs in the pullback process, thus etching control of the silicon nitride film 3 can be difficult. As illustrated in FIG. 7(*a*), the amount of etching of the silicon nitride film 3 may be low after the etching in the pullback process. Therefore, if the silicon nitride film 3a forms an overhanging shape on the top section of the trench 4, a cavity 18 my be formed in the trench element separation material 8. In this case, the diffusion layer 17 may be formed evenly on the surface section of the silicon substrate 1.

As illustrated in FIG. 7(*b*), in the case where the amount of etching of the silicon nitride film 3 is high, the silicon nitride film 3a moves backwards from the top section of the trench 4 and the cavity does not occur after the pullback process etching. However, an uneven diffusion layer 17a can easily form on the surface section of the silicon substrate 1. This can be due to the trench element separation insulating material 8 becoming a mask in the ion implantation process, which may prevent underneath impurity implantation. The non-uniformity of this diffusion layer may have a great influence on the threshold value of a subsequently formed IGFET such as a MOS transistor.

Figure 8:
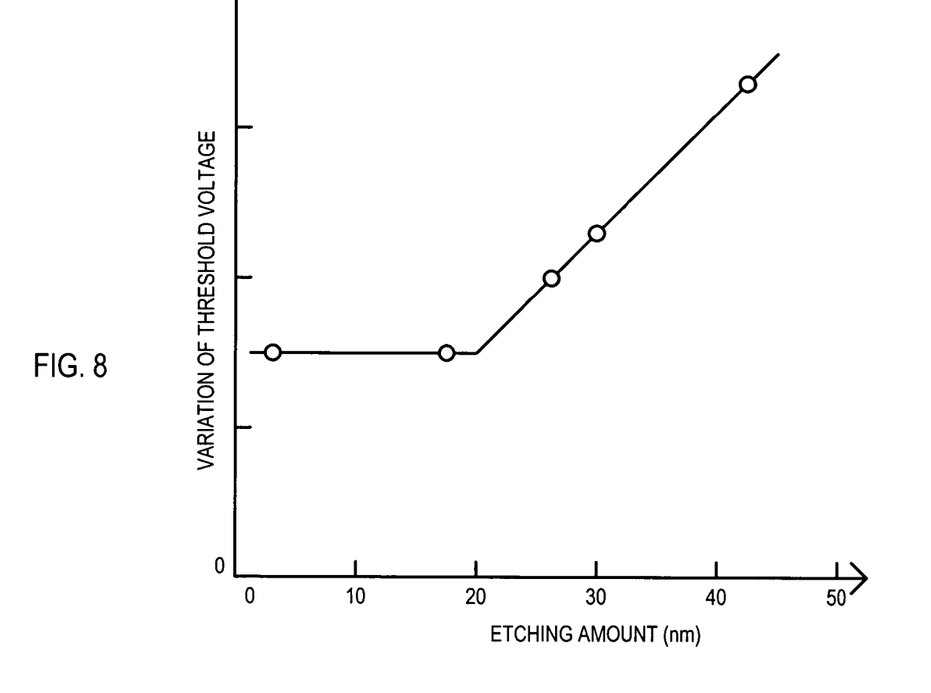
FIG. 8 is a graph illustrating the relationship between the variation of the threshold value of a MOS transistor and the etching amount of a silicon nitride film in a pullback process according to an embodiment.

Referring now to FIG. 8, a graph illustrating the relationship between the variation of the threshold value of the MOS transistor and the etching amount of the silicon nitride film 3 in the pullback process according to an embodiment is set forth. The variation of the threshold value is for N-type MOS transistors in one semiconductor device manufacturing lot.

As illustrated in FIG. 8, before the etching amount of the silicon nitride film 3 in the pullback process reaches a certain value (about 20 nm), the variation of the threshold value may be constant. However, as the etching amount increases, the variation of the threshold value increases linearly with the etching amount. The certain value (about 20 nm in this case) can be where the edge of the trench element separation insulation material 8 and the top section of the trench 4 are essentially located on the same plane in the ion implantation process as described in FIG. 6. Such a phenomenon may be remarkably apparent as the MOS transistor is miniaturized and the channel width becomes small.

In the above embodiment, the filling insulation film may be deposited by a bias ECR method. The present invention may be similarly applicable to the case where the filling insulation film is deposited by a CVD method using high density plasma excitation, as just one example. Furthermore, in the embodiment, a case where the filling insulation film includes silicon oxide film is described. The present invention may be similarly applicable to a case where the filling insulation film includes a silicon oxynitride film, as just one example.

Also, in the present invention, a case where a silicon nitride film is included as an oxidation resistant insulation film is described. The present invention should not be limited to this. For example, the present invention may be similarly applicable to other films such as an alumina film or the like, as just one example.

Furthermore, the present invention should not be limited to the case where a trench element separation region is formed. The present invention may also be applicable to the case where an oxidation resistant insulation film such as a silicon nitride film is removed by etching after being formed by LOCOS (local oxidation of silicon), as just one example.

It is understood that the embodiments described above are exemplary and the present invention should not be limited to those embodiments. Specific structures should not be limited to the described embodiments.

As described above, in the present invention, a trench element may be formed on the surface of a semiconductor substrate. A first insulation film and a second insulation film, which may be resistant to oxidation, may be deposited onto the surface of the semiconductor substrate in that order for patterning. The semiconductor substrate may be dry etched using the second insulation film pattern as an etching mask. Furthermore, the semiconductor substrate may be thermally oxidized using the second insulation film pattern as an oxidation mask. During the thermal oxidation step, a modified layer may be formed on the surface of the second insulation film. The modified layer may be removed by a neutral radical containing fluorine. Then, after the modified layer is removed, the surface of the second insulation film may be etched by a predetermined thickness. After the surface of the second insulation film is etched, a filling insulation film may be deposited over the whole surface of the trench so as to fill it completely. The filling insulation film may be chemical mechanical polished using the second insulation film as a polishing stopper to form a trench filling insulating material. In the present invention, the top section of the trench and the edges of the trench element separation insulating material may be formed so as to be essentially located on the same plane in the trench element separation region.

As a result, the formation of cavities at the edges of the trench element separation insulating material filling the trench may be suppressed. In this way, there may be no dispersion of the depth of an impurity implantation region. In a MOS transistor having a trench element separation region, the hump phenomenon as previously described may be suppressed and the threshold value may be accurately controlled. Thus, an IGFET, such as a MOS transistor, may be electrically isolated from other device elements, such as other IGFETs, by the trench element separation region. In this manner, an IGFET, such as a MOS transistor, having a trench element separation region may be formed with improved controllability and improved yield.

Furthermore, miniaturization of an IGFET, such as a MOS transistor, having a trench element separation region may be simplified and increased integration and densification of a semiconductor device may be expedited and increased reliability and increased yield of semiconductor devices may be achieved.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method for forming a trench element separation region on a surface of a semiconductor substrate, comprising the steps of:

depositing a first insulation film onto the surface of the semiconductor substrate;

depositing and patterning a second insulation film on the first insulation film to form a second insulation film pattern;

dry etching the semiconductor substrate using the second insulation film pattern as an etching mask to form a trench;

forming an oxide film on an inner wall of the trench by thermally oxidizing the semiconductor substrate using the second insulation film pattern as an oxidation mask;

removing a modified layer formed on the surface of the second insulation film during the thermal oxidation step by using a neutral radical including fluorine;

etching the surface of the second insulation film by a predetermined thickness after the modified layer is removed;

depositing a filling insulation film over the whole surface of the trench to completely fill the trench after the surface of the second insulation film is etched; and chemically mechanical polishing the filling insulation film using the second insulation film as a polishing stopper to form a trench filling insulating material.

2. The method for forming a trench element separation region according to claim 1, wherein:
the second insulation film includes a silicon nitride film.

3. The method for forming a trench element separation region according to claim 1, wherein:
the semiconductor substrate is a silicon substrate and the neutral radical is a fluorine radical.

4. The method for forming a trench element separation region according to claim 3, wherein:
a final judgment of the modified layer removal is performed by measuring a change in intensity of emissions with a wavelength of approximately 336 nm from a reaction product NH.

5. The method for forming a trench element separation region according to claim 3, wherein:
a final judgment of the modified layer removal is performed by measuring a change in intensity of emissions with a wavelength of approximately 388 nm from a reaction product CN.

6. The method for forming a trench element separation region according to claim 3, wherein:
the thickness of the second insulation film is etched for adjustment such that edges of the trench insulating material above the inner walls of the trench are essentially located on the same plane as edges of the inner walls of the trench in a top section of the trench.

7. The method for forming a trench element separation region according to claim 3, further including the step of:
forming a doped channel layer of an insulated gate field effect transistor (IGFET) by ion implantation and heat treatment after the trench filling insulating material is formed.

8. The method for forming a trench element separation region according to claim 3, wherein:
the first insulation film is a silicon oxide film formed by thermal oxidation of the semiconductor substrate; and
the filling insulation film is a silicon oxide film deposited by a vapor deposition method.

9. The method for forming a trench element separation region according to claim 3, wherein:
the trench element separation region isolates a first insulated gate field effect transistor (IGFET) from a second IGFET.

10. The method for forming a trench element separation region according to claim 1, wherein:
the step of etching the surface of the second insulating film has essentially no etching inoperative time.

11. The method for forming a trench element separation region according to claim 1, wherein:
the step of etching the surface of the second insulating film etches the surface of the second insulating film less than about 20 nm.

12. The method for forming a trench element separation region according to claim 1, wherein:
the modified layer includes an oxide nitride film.

13. The method for forming a trench element separation region according to claim 1, wherein:
the step of removing the modified layer etches the oxide film less than 9 nm.

14. The method for forming a trench element separation region according to claim 1, wherein:
the step of removing the modified layer etches the oxide film less than 5 nm.

15. The method for forming a trench element separation region according to claim 1, wherein:
the step of removing the modified layer etches the oxide film less than 3 nm.

16. The method for forming a trench element separation region according to claim 1, wherein:
the step of removing the modified layer etches includes exciting a gas including $CHF_3$.

17. The method for forming a trench element separation region according to claim 1, wherein:
the step of removing the modified layer etches includes exciting a gas including $CF_4$.

18. The method for forming a trench element separation region according to claim 1, wherein:
the first insulation film is a silicon oxide film formed by thermal oxidation of the semiconductor substrate; and
the filling insulation film is a silicon oxide film deposited by a chemical vapor deposition using a bias Election Cyclotron Resonance.

19. The method for forming a trench element separation region according to claim 1, further including the step of:
training a laser on the surface of the filling insulating material.

20. The method for forming a trench element separation region according to claim 19, further including the step of:
the laser is selected from a group consisting of an excimer laser from fluorine ($F_2$) gas and an excimer laser from ArF gas.

* * * * *